US 11,086,307 B2

United States Patent
Nishida (10) Patent No.: US 11,086,307 B2
(45) Date of Patent: Aug. 10, 2021

(54) COMPONENT MOUNTING LINE CONTROL SYSTEM THAT INCREASES MANUFACTURING PROCESSING TIME IN RESPONSE TO OPERATOR LOCATION AND STORAGE CAPACITY INFORMATION

(71) Applicant: Panasonic Intellectual Property Management Co., Ltd., Osaka (JP)

(72) Inventor: Hiroyoshi Nishida, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/700,401

(22) Filed: Sep. 11, 2017

(65) Prior Publication Data
US 2018/0095453 A1    Apr. 5, 2018

(30) Foreign Application Priority Data

Sep. 30, 2016 (JP) ............................ JP2016-192821

(51) Int. Cl.
G05B 19/418 (2006.01)
H05K 13/08 (2006.01)
H05K 13/00 (2006.01)

(52) U.S. Cl.
CPC ... G05B 19/4189 (2013.01); G05B 19/41875 (2013.01); H05K 13/0061 (2013.01);
(Continued)

(58) Field of Classification Search
CPC .......... G05B 19/4189; G05B 19/41875; G05B 19/41865; G05B 2219/45029;
(Continued)

(56) References Cited

U.S. PATENT DOCUMENTS 4,667,403 A * 5/1987 Edinger ............. G05B 19/4183
29/840
5,237,508 A * 8/1993 Furukawa ........ G05B 19/41865
700/100
(Continued)

FOREIGN PATENT DOCUMENTS

CN     101208640 A    6/2008
EP       2916188 A1    9/2015
(Continued)

OTHER PUBLICATIONS

English Translation of Chinese Search Report dated Dec. 4, 2020 for the related Chinese Patent Application No. 201710870862.3.

*Primary Examiner* — Kenneth M Lo
*Assistant Examiner* — Jonathan Michael Skrzycki
(74) *Attorney, Agent, or Firm* — Pearne & Gordon LLP (57) ABSTRACT

A component mounting line control system controls a component mounting line. The component mounting line includes a component mounting device and a board retrieving unit. The component mounting line control system includes an acquirer and a controller. The acquirer acquires information from the board retrieving unit. The controller controls the component mounting device based on the information acquired by the acquirer. The controller lengthens a time taken for a manufacturing process in the component mounting device in a case where the acquirer acquires first warning information, which indicates that a board accommodation limit is about to be reached, from the board retrieving unit.

11 Claims, 5 Drawing Sheets

(52) U.S. Cl.
CPC ..... *H05K 13/085* (2018.08); *G05B 19/41865* (2013.01); *G05B 2219/32265* (2013.01); *G05B 2219/45029* (2013.01); *Y02P 90/02* (2015.11)

(58) Field of Classification Search
CPC ....... G05B 2219/32265; H05K 13/085; H05K 13/0061; H05K 13/0495; Y02P 90/20; Y02P 90/04
See application file for complete search history.

(56) References Cited

U.S. PATENT DOCUMENTS

| | | |
|---|---|---|
| 2002/0073537 A1 | 6/2002 | Sumi |
| 2009/0099678 A1* | 4/2009 | Kurata ................. H05K 13/086 700/106 |
| 2010/0287879 A1* | 11/2010 | Donati ............. G05B 19/41845 53/52 |
| 2013/0001028 A1* | 1/2013 | Calliari .............. B23Q 11/0082 188/110 |
| 2014/0244044 A1* | 8/2014 | Davis ................. H05B 37/0272 700/276 |
| 2015/0107088 A1 | 4/2015 | Sagara et al. |
| 2016/0179081 A1* | 6/2016 | Sun .................... G05B 19/4069 700/97 |

FOREIGN PATENT DOCUMENTS

| | | |
|---|---|---|
| EP | 2988583 A1 | 2/2016 |
| JP | H07-006939 A | 1/1995 |
| JP | 2002-057492 A | 2/2002 |
| JP | 2015-082578 A | 4/2015 |
| JP | 2015-153914 A | 8/2015 |
| WO | 2014/068664 A1 | 5/2014 |

* cited by examiner

COMPONENT MOUNTING LINE CONTROL SYSTEM THAT INCREASES MANUFACTURING PROCESSING TIME IN RESPONSE TO OPERATOR LOCATION AND STORAGE CAPACITY INFORMATION

BACKGROUND

1. Technical Field

The present disclosure relates to a component mounting line control system that controls a component mounting line for manufacturing a component-mounted board.

2. Description of the Related Art

The component mounting line for manufacturing a component-mounted board is configured to include a plurality of component mounting devices such as a printing device, a component mounting device, and a reflow device (for example, refer to PTL 1). The printing device prints solder on a board. The component mounting device mounts a component on the board on which the solder has been printed. The board with the component mounted thereon is heated by the reflow device so that the component is soldered to a wiring circuit provided on the board. In the related art disclosed in PTL 1, operation parameters such as a printing speed of the printing device, a component mounting speed of the component mounting device, and a heating temperature or a heating time in the reflow device are corrected depending on the state of the component mounting line (surface mounting line). Accordingly, it is possible to manage product quality according to an operating state of the component mounting line.

CITATION LIST

Patent Literature

PTL 1: Japanese Patent Unexamined Publication No. 2015-153914

SUMMARY

A component mounting line control system controls a component mounting line.

The component mounting line includes a component mounting device and a board retrieving unit.

The component mounting device mounts a component on a board.

The board retrieving unit retrieves the board.

The component mounting line control system includes an acquirer and a controller.

The acquirer acquires information from the board retrieving unit.

The controller controls the component mounting device based on the information acquired by the acquirer.

The controller lengthens a time taken for a manufacturing process in the component mounting device in a case where the acquirer acquires first warning information, which indicates that a board accommodation limit is about to be reached, from the board retrieving unit.

DETAILED DESCRIPTION

In the related art, congestion of component-mounted boards to be discharged from a component mounting line may occur. Even if operation parameters such as an operation speed in each piece of equipment in a component mounting line are maintained to be suitable for quality management, there may be an unpredictable variation in actual manufacturing speed due to various disturbance factors such as supply of an abnormal component and a mechanism trouble when the component mounting line is actually operated. Such a variation in manufacturing speed causes congestion of component-mounted boards at an exit of the component mounting line and stops the manufacture in the component mounting line. As a result, a decrease in operating rate of the component mounting line may occur and the productivity may be inhibited from being improved.

Next, an embodiment of the present disclosure will be described with reference to drawings. First, a configuration of component mounting system 1 will be described with reference to FIG. 1. Component mounting system 1 has a function of manufacturing a component-mounted board by mounting an electronic component on a board through soldering. Component mounting system 1 includes component mounting line 1a in which a plurality of component mounting devices (which will be described later) are connected to each other and comprehensive line control device 4 that is connected to the plurality of component mounting devices via communication network 2a and comprehensively controls component mounting line 1a.

Figure 1:
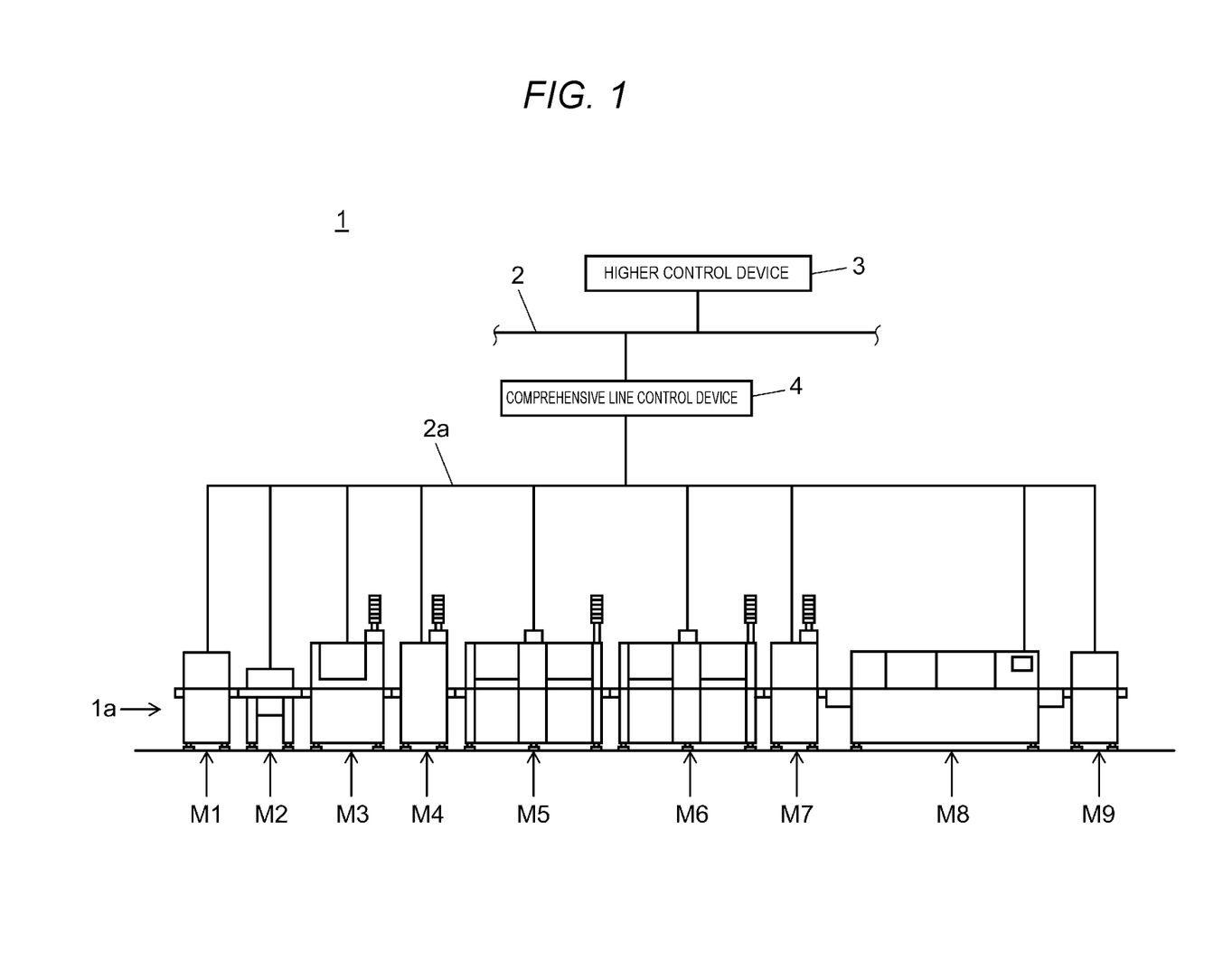
FIG. 1 is a diagram for explaining a configuration of a component mounting system according to an embodiment.

Another component mounting line (not shown) may be disposed in component mounting system 1. Each device in the other component mounting line is connected to another comprehensive line control device. The plurality of comprehensive line control devices are connected to higher control device 3 via communication network 2 and higher control device 3 has a function of comprehensively controlling the plurality of comprehensive line control devices.

Next, a configuration of component mounting line 1a according to the embodiment will be described. Each component mounting line 1a is configured by connecting board supplying device M1, board transferring device M2, printing device M3, printing inspection device M4, first component mounting device M5, second component mounting device M6, and mounting state inspecting device M7 reflow device M8, and board retrieving device M9 as a board retrieving unit, each of which is a component mounting device, in series. That is, component mounting line 1a is configured to include the plurality of component mounting devices each of which mounts a component on a board and the board retrieving unit that retrieves a board from the component mounting devices.

Each component mounting device in component mounting line 1a has a board transporting mechanism for transporting a board and a board transportation path is formed with the board transporting mechanisms being connected in series. In component mounting line 1a, printing device M3, printing inspection device M4, first component mounting device M5, second component mounting device M6, mounting state inspecting device M7, and reflow device M8 perform a component mounting operation of mounting a component on a board that is transported along the board transportation path after being supplied by board supplying device M1 and being transferred by board transferring device M2.

That is, a board supplied by board supplying device M1 is transported into printing device M3 via board transferring device M2 and a solder printing operation of printing solder for bonding a component on the board through a screen printing process is performed in printing device M3. The board after the solder printing operation is transferred to printing inspection device M4 and a printing inspection operation for the solder printed on the board is performed in printing inspection device M4. The board after the printing inspection operation is transferred to first component mounting device M5 and second component mounting device M6 sequentially and a component mounting operation of mounting a component on the board after the solder printing operation is performed in each of first component mounting device M5 and second component mounting device M6.

The board after the component mounting operation is transported into mounting state inspecting device M7 and a mounting state inspecting operation for the component mounted on the board is performed in mounting state inspecting device M7. The board after the mounting state inspecting operation is transported into reflow device M8 and is heated according to a predetermined heating profile so that the solder for bonding the component is molten and solidified. Accordingly, the component is soldered to the board and a component-mounted board, which is obtained by mounting a component on a board, is completed. The component-mounted board is retrieved by board retrieving device M9 as the board retrieving unit.

Here, as the board retrieving unit that retrieves the component-mounted board, board retrieving device M9 which retrieves a board and in which boards are accommodated in a board accommodation container such as a magazine in which boards are accommodated while being stacked is used. The board retrieving unit according to the embodiment may have any function as long as the board retrieving unit has a buffer function of holding a predetermined number of component-mounted boards in a congested state. For example, if a board transportation conveyer of which the transportation length has been set to correspond to the desired number of buffers is used as a board transportation conveyer for transporting a component-mounted board transported from reflow device M8 to be subject to a downstream process, the board transportation conveyer can function as the board retrieving unit.

In component mounting line 1a, the operation processes performed by board supplying device M1 to reflow device M8 which are positioned on the upstream side of board retrieving device M9 correspond to an upstream process with respect to the board retrieving unit. In the embodiment, congestion of boards at the exit of component mounting line 1a is suppressed since the time taken for a manufacturing process in the upstream process is appropriately adjusted and an operator appropriately retrieves a board corresponding to the state of congestion of boards in the board retrieving unit. Hereinafter, a configuration of a component mounting line control system which component mounting system 1 includes for realizing the above-described function will be described with reference to FIG. 2.

Figure 2:
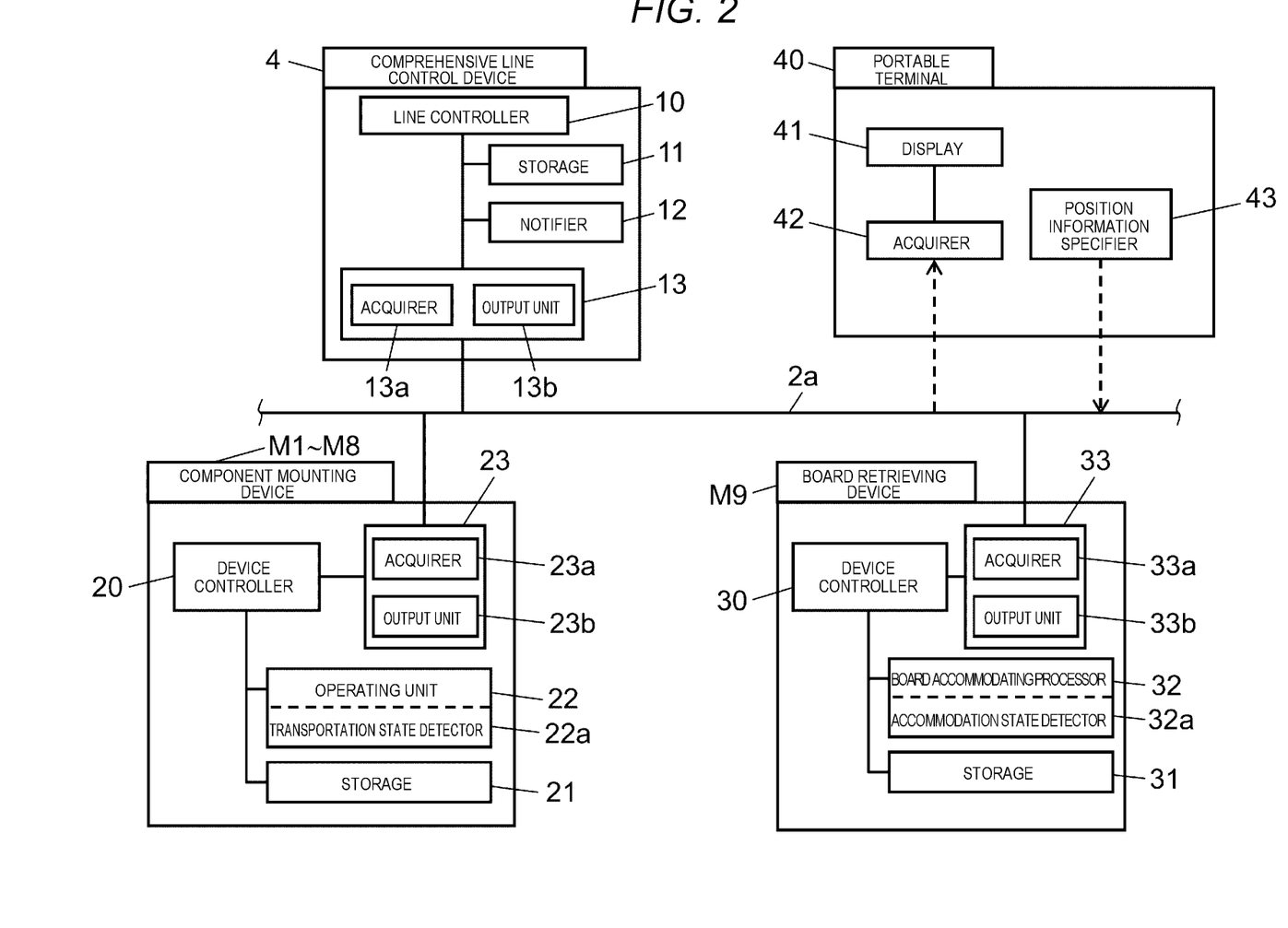
FIG. 2 is a block diagram illustrating a configuration of a controlling system in a component mounting line control system according to the embodiment.

In FIG. 2, comprehensive line control device 4 includes line controller 10, storage 11, notifier 12, and communicator 13. Line controller 10 has a function as a controller in the component mounting line control system which controls each device in component mounting line 1a. Storage 11 stores data necessary for comprehensive line control device 4 to adjust the state of a manufacturing process in each device in component mounting line 1a (refer to manufacturing process time lengthening process data 50 in FIG. 3). Notifier 12 is equipment such as a display screen, a display lamp, or a warning device which notifies the operator of a predetermined item. In the embodiment, notifier 12 notifies the operator of a board accommodation state in board retrieving device M9.

Communicator 13 is a communication interface and includes acquirer 13a and output unit 13b. Acquirer 13a acquires information from each device constituting component mounting line 1a via communication network 2a and acquires information from higher control device 3 via communication network 2. Similarly, output unit 13b outputs information from line controller 10 to each of the devices. In the embodiment, acquirer 13a acquires the following information from board retrieving device M9 which is the board retrieving unit and line controller 10 controls the component mounting devices (board supplying device M1 to reflow device M8) based on the acquired information.

Each of the component mounting devices (board supplying device M1 to reflow device M8) includes device controller 20, storage 21, operating unit 22, and communicator 23. Device controller 20 is a control device that controls each unit in each device and controls operating unit 22 of the component mounting device while being controlled based on information from line controller 10 of comprehensive line control device 4. Operating unit 22 is a unit having a function of performing an individual operation corresponding to the kind of each device. When operating unit 22 is controlled, operation execution data stored in storage 21 is referred to. In this manner, an operation execution state such as the time taken for a manufacturing process in each device is adjusted. Operating unit 22 is provided with transportation state detector 22a and can detect an abnormal board transportation state in each device, for example, a "transportation stoppage" in which a board is halted without being transported normally.

Communicator 23 is a communication interface and includes acquirer 23a and output unit 23b. Acquirer 23a acquires information from comprehensive line control device 4 via communication network 2a and acquires information from higher control device 3 via communication network 2. Output unit 23b outputs information from device controller 20 to each of the devices. The output information includes information related to the "transportation stoppage" detected by transportation state detector 22a.

Board retrieving device M9 includes device controller 30, storage 31, board accommodating processor 32, and communicator 33. Device controller 30 is a control device that controls each unit in board retrieving device M9 and controls board accommodating processor 32, which performs a board accommodating operation in board retrieving device M9, while being controlled based on information from line controller 10 of comprehensive line control device 4. At this time, the operation execution data stored in storage 31 is referred to. In this manner, an operation execution state such as the board transportation speed in board retrieving device M9 is adjusted. Board accommodating processor 32 is provided with accommodation state detector 32a and can detect the board accommodation state in board retrieving device M9. For example, board accommodating processor 32 can detect whether the number of accommodated boards has reached the accommodation limit, whether the accommodation limit is about to be reached, or whether retrieval of boards from board retrieving device M9 is completed.

Communicator 33 is a communication interface and includes acquirer 33a and output unit 33b. Acquirer 33a acquires information from comprehensive line control device 4 via communication network 2a and acquires information from higher control device 3 via communication network 2. Output unit 33b outputs information from device controller 30 to each of the devices. The output information includes information related to a board accommodation state detected by accommodation state detector 32a.

Portable terminal 40 is a terminal device for operation or notification which is carried by an operator who is in charge of operation or maintenance of component mounting line 1a. Portable terminal 40 includes display 41, acquirer 42, and position information specifier 43 and can receive a signal or information from comprehensive line control device 4 through acquirer 42 in a wireless manner. Received information is displayed on display 41 and thus the operator can receive information such as an operation instruction transmitted from comprehensive line control device 4. Position information specifier 43 is a transmitting device that has a global positioning system (GPS) function and transmits the location of the operator carrying portable terminal 40 to comprehensive line control device 4. Accordingly, comprehensive line control device 4 can grasp the location of the operator, who is in charge of component mounting line 1a, at all times. Position information specifier 43 may not be a transmitting device that has the GPS function as long as position information specifier 43 can grasp the location of the operator. For example, position information specifier 43 may be a beacon.

Here, warning information which acquirer 13a of comprehensive line control device 4 acquires from each device constituting component mounting line 1a will be described. In the embodiment, comprehensive line control device 4 acquires three kinds of warning information (first warning information to third warning information) related to the board accommodation state which are output from board retrieving device M9 as the board retrieving unit and acquires fourth warning information related to the board transportation state which is output from the component mounting devices (board supplying device M1 to reflow device M8) in component mounting line 1a.

The first warning information is information indicating that the board accommodation state in board retrieving device M9 is a state where the board accommodation limit is about to be reached. Here, the state where the board accommodation limit is about to be reached is a state where the number of accommodated boards is equal to or greater than 70% and equal to or smaller than 90% of the accommodation capacity (number of boards corresponding to accommodation limit) of board retrieving device M9. If acquirer 13a of comprehensive line control device 4 acquires the first warning information, line controller 10 performs control to lengthen the time taken for the manufacturing process in the component mounting devices (board supplying device M1 to reflow device M8) in component mounting line 1a. At the same time, comprehensive line control device 4 performs notification indicating that it is necessary to retrieve a board in board retrieving device M9 by using notifier 12 or display 41 of portable terminal 40.

The second warning information is information indicating that board accommodation state in board retrieving device M9 is a state where the board accommodation limit has been reached and it is almost not possible to accommodate additional boards. Here, the state where the board accommodation limit has been reached is a state where the number of accommodated boards is greater than 90% and equal to or smaller than 100% of the accommodation capacity (number of boards corresponding to accommodation limit) of board retrieving device M9. Therefore, if acquirer 13a of comprehensive line control device 4 acquires the second warning information, line controller 10 performs control to cause the component mounting devices (board supplying device M1 to reflow device M8) in component mounting line 1a to stop the manufacturing process.

Regarding the board accommodation state, it may be determined whether the sum of the number of boards accommodated in board retrieving device M9 and the number of boards transported into reflow device M8 has reached the number of boards corresponding to the accommodation limit or not. If the number of boards transported into reflow device M8 is also considered when determining the board accommodation state, it is possible to further improve the productivity. Specifically, in a case where the board accommodation state is a state where the number of boards corresponding to the accommodation limit has been reached, the operation for a board transported in reflow device M8 is performed normally and a board to be transported into reflow device M8 are stopped so that the board in reflow device M8 is prevented from being stopped in reflow device M8 and being excessively heated.

The third warning information is information indicating that an abnormality has occurred during an accommodation operation or the like in board retrieving device M9 and retrieval of a board has been stopped. Therefore, if acquirer 13a of comprehensive line control device 4 acquires the third warning information, line controller 10 performs control to lengthen the time taken for the manufacturing process in the component mounting devices (board supplying device M1 to reflow device M8) in component mounting line 1a.

The fourth warning information is a transportation stopping signal indicating that the "transportation stoppage" in which a board is halted in the component mounting devices (board supplying device M1 to reflow device M8) in component mounting line 1a has occurred. If acquirer 13a of comprehensive line control device 4 acquires the fourth warning information, line controller 10 performs control to cause the component mounting devices (board supplying device M1 to reflow device M8) in component mounting line 1a to stop the manufacturing process.

Figure 3:
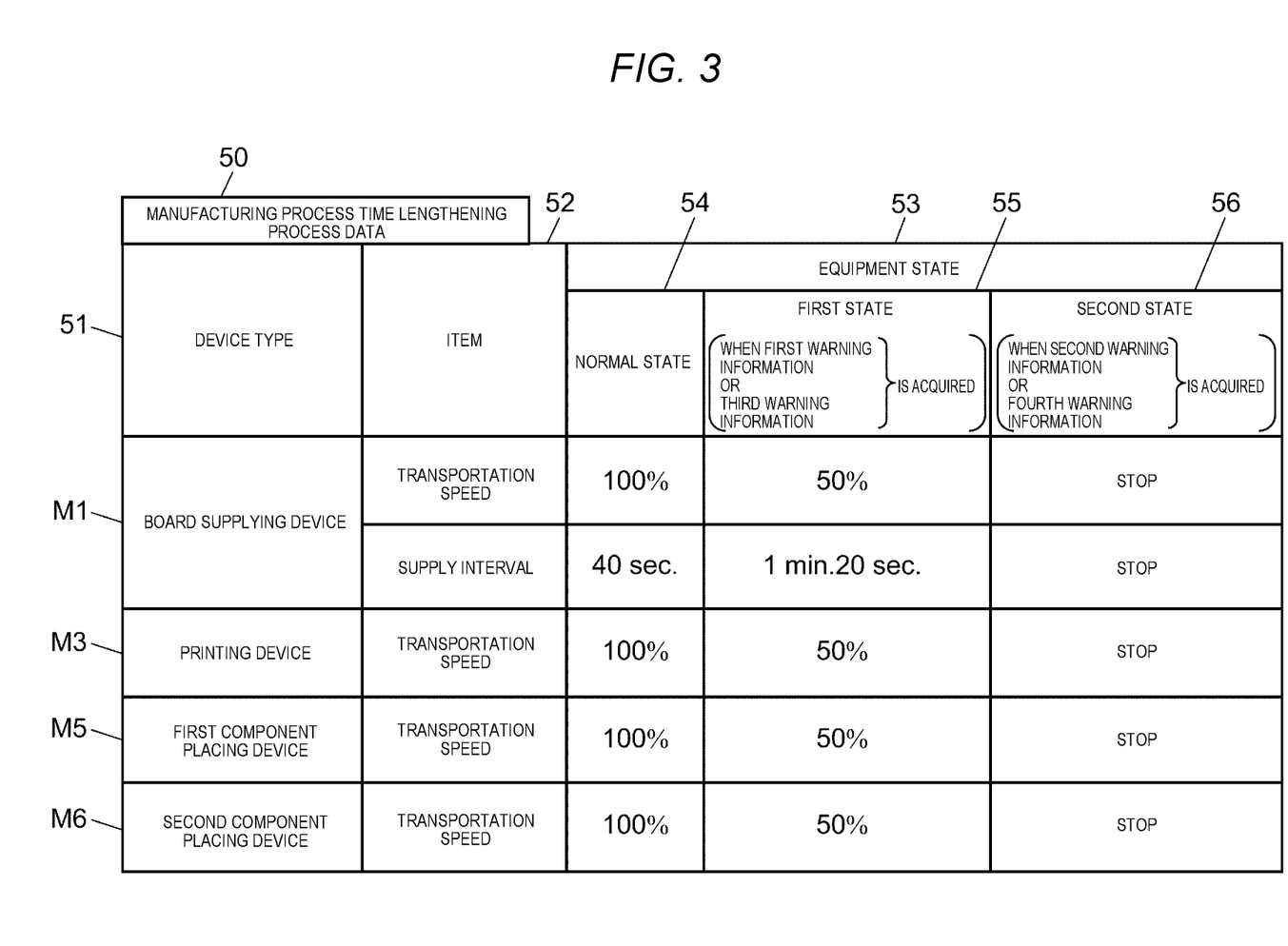
FIG. 3 is an explanation diagram illustrating manufacturing process time lengthening process data which is used in the component mounting line control system according to the embodiment.

The above-described process is performed based on manufacturing process time lengthening process data 50 stored in storage 11 (or any of storage devices included in devices constituting component mounting system 1). As illustrated in FIG. 3, manufacturing process time lengthening process data 50 prescribes an execution state of the manufacturing process time lengthening process which is performed if acquirer 13a of comprehensive line control device 4 acquires the first warning information, the second warning information, the third warning information, or the fourth warning information. That is, a specific setting value or setting state for "item" 52 corresponding to the state of each device prescribed in "equipment state" 53 is prescribed for each "item" 52 of a device prescribed in "device type" 51.

As "equipment state" 53, "normal state" 54 indicating a state where a device is operated normally, "first state" 55 indicating a state where the first warning information or the third warning information has been acquired, and "second state" 56 indicating a state where the second warning information or the fourth warning information has been acquired are prescribed. A change value and a change state for "first state" 55 and "second state" 56 are prescribed for each "item" 52 in advance by using a setting value for "normal state" 54 as the standard.

With regard to board supplying device M1, "transportation speed" and "supply interval" are prescribed as "Item" 52. With regard to "transportation speed", decreasing the speed to 50% in "first state" 55 by using the speed for "normal state" 54 (100%) as the standard and stopping the transportation in "second state" 56 are prescribed. In addition, with regard to "supply interval", increasing the time interval to (1 min 20 sec.) in "first state 55" by using the time interval for "normal state" 54 (40 sec.) as the standard and stopping a supplying operation in "second state 56" are prescribed.

In addition, with regard to printing device M3, first component mounting device M5, and second component mounting device M6, only "transportation speed" is prescribed as "Item" 52. For any of the above-described devices, decreasing the speed to 50% in "first state" 55 by using the speed for "normal state" 54 (100%) as the standard and stopping the transportation in "second state" 56 are prescribed.

Figure 4:
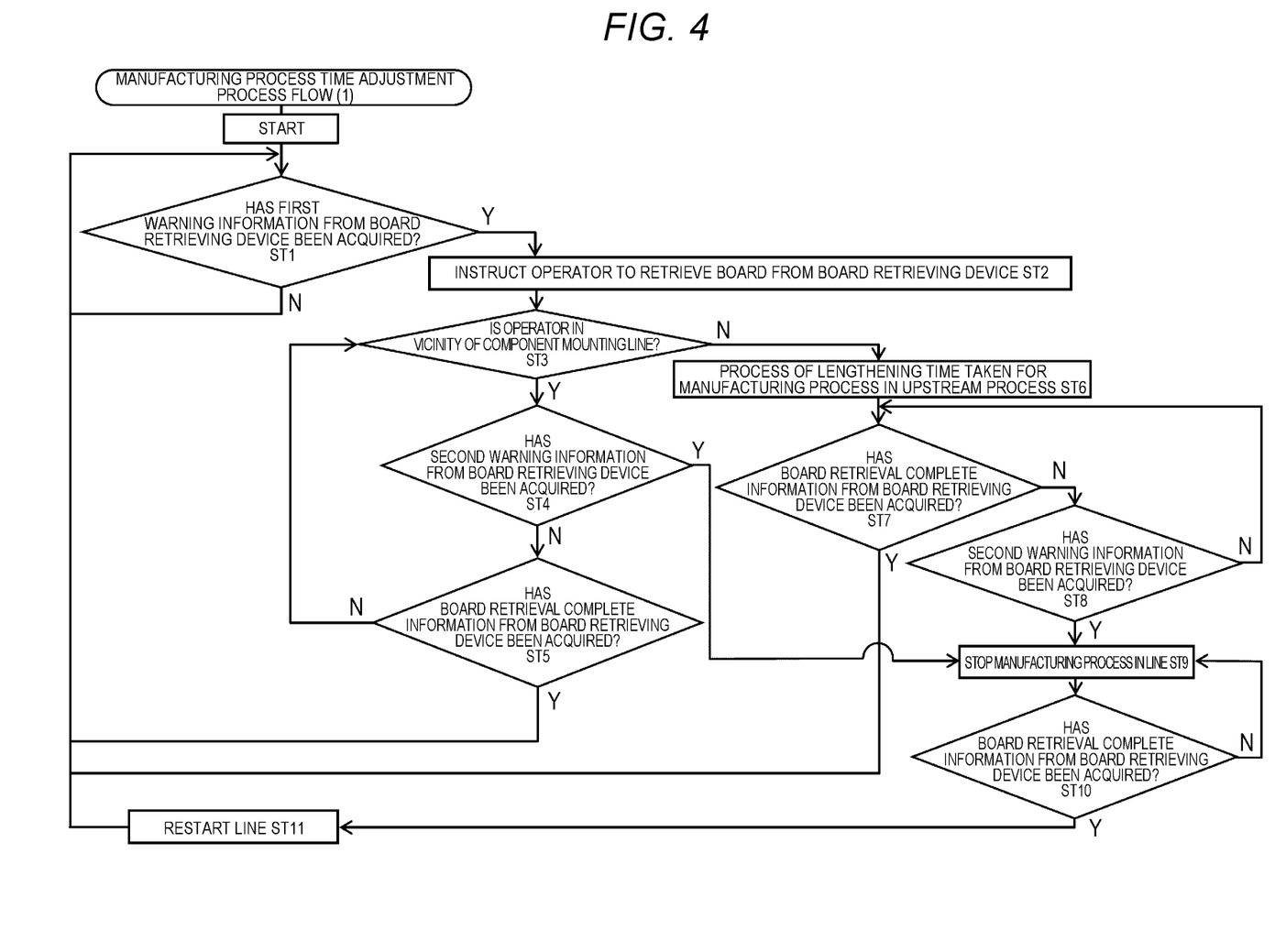
FIG. 4 is a flow chart illustrating a manufacturing process time adjustment flow in the component mounting line control system according to the embodiment.
Figure 5:
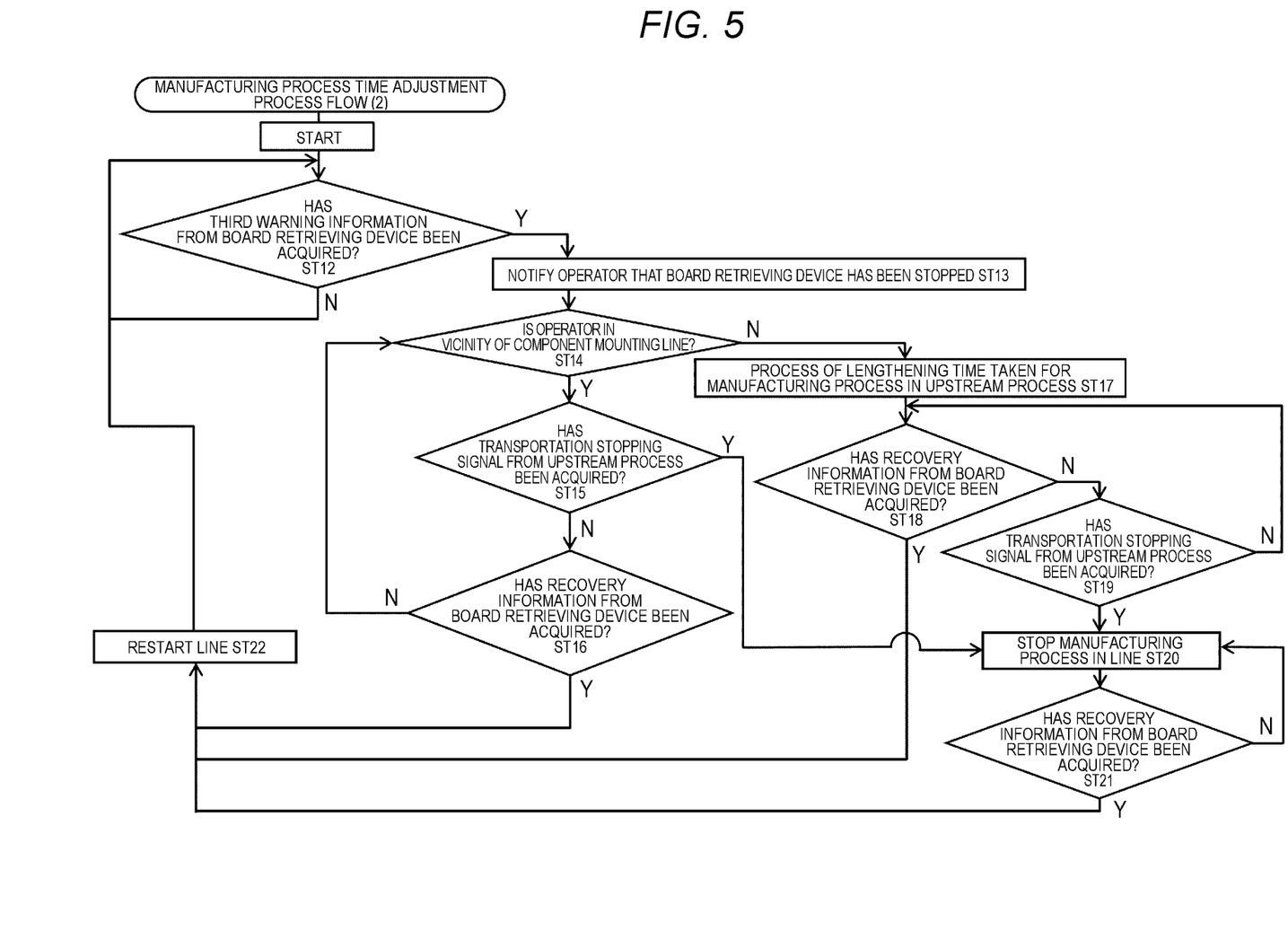
FIG. 5 is a flow chart illustrating the manufacturing process time adjustment flow in the component mounting line control system according to the embodiment.

Next, a manufacturing process time adjustment process flow which comprehensive line control device 4 performs based on above-described manufacturing process time lengthening process data 50 will be described with reference to FIGS. 4 and 5. Manufacturing process time adjustment process flow (1) in FIG. 4 is related to a process applied in a case where the board accommodation in board retrieving device M9 is a state where the accommodation limit has been reached. In addition, manufacturing process time adjustment process flow (2) in FIG. 5 is related to a process applied in a case where the board accommodating operation in board retrieving device M9 has been stopped. Although an example in which line controller 10 of comprehensive line control device 4 performs the manufacturing process time adjustment process will be described here, the manufacturing process time adjustment process may be performed by higher control device 3.

First, when manufacturing process time adjustment process flow (1) in FIG. 4 is started and the process is started, line controller 10 determines whether the first warning information from board retrieving device M9 has been acquired or not (ST1). If it is not confirmed that the first warning information has been acquired, the process returns to (ST1) and monitoring is continued. If it is confirmed that the first warning information has been acquired, the operator is instructed to retrieve a board from board retrieving device M9 (ST2). Here, notifier 12 included in comprehensive line control device 4 notifies the operator of the above-described instruction or instruction information is transmitted to portable terminal 40 carried by the operator and is displayed on display 41 so that the operator is notified of the above-described instruction. That is, notifier 12 or display 41 which functions as a notifier notifies the operator that it is necessary to retrieve a board in board retrieving device M9.

Next, it is determined whether the operator is in the vicinity of component mounting line 1a based on operator location information output from position information specifier 43 of portable terminal 40 (ST3). In a case where it is determined that the operator is in the vicinity of component mounting line 1a in (ST3), it is determined whether the second warning information from board retrieving device M9 has been acquired (ST4). If it is confirmed that the second warning information has not been acquired in (ST4), it is determined that the operator has retrieved a board from board retrieving device M9 and it is confirmed whether board retrieval complete information from board retrieving device M9 has been acquired (ST5). If it is confirmed that the board retrieval complete information has not been acquired in (ST5), the process returns to (ST3) and the operator is located again. If it is confirmed that the board retrieval complete information has been acquired in (ST5), the process returns to (ST1).

The determination on whether the operator is in the vicinity of component mounting line 1a, which is performed in (ST3), is performed by determining whether the operator is separated from the vicinity of board retrieving device M9 by less than a predetermined distance. The predetermined distance may be set to any value. For example, the predetermined distance is set to fall within a range of 0 to 100 meters. In addition, in a case where it is determined that the operator is in the vicinity of component mounting line 1a in (ST3) but the operator cannot cope with the operation, portable terminal 40 transmits information indicating that the operator cannot cope with the operation to comprehensive line control device 4 and portable terminal 40 that has transmitted the information is excluded from the operator list.

In addition, in a case where the location of the operator has not been found in (ST3), it is determined that an operation of retrieving a board from board retrieving device M9 cannot be performed immediately and a process of lengthening the time taken for the manufacturing process in the upstream process (board supplying device M1 to reflow device M8) is performed (ST6). That is, in a case where acquirer 13a acquires the first warning information from board retrieving device M9, line controller 10 performs control to lengthen the time taken for the manufacturing process in board supplying device M1 to reflow device M8, which are the component mounting devices of the upstream process.

If the number of boards accommodated in board retrieving device M9 decreases as a result of the manufacturing process time lengthening process performed in this manner, it is confirmed whether the board retrieval complete information from board retrieving device M9 has been acquired (ST7). If it is confirmed that the board retrieval complete information has been acquired in (ST7), the process returns to (ST1) as with (ST5). If it is confirmed that the board retrieval complete information has not been acquired in (ST7), it is confirmed whether the second warning information from board retrieving device M9 has been acquired (ST8).

If it is confirmed that the second warning information has not been acquired in (ST8), the process returns to (ST7). If it is confirmed that the second warning information has been acquired in (ST8), it is determined that board retrieving device M9 is in an accommodation limit reached state and the manufacturing process in component mounting line 1a is stopped (ST9). In a case where it is confirmed that the second warning information has been acquired in (ST4), the process proceeds to (ST9) and the manufacturing process in component mounting line 1a is stopped as with (ST8). That is, in a case where acquirer 13a acquires the second warning information, line controller 10 performs control to cause the component mounting devices to stop the manufacturing process.

If the number of boards accommodated in board retrieving device M9 decreases as a result of the manufacturing process in the line being stopped in this manner, it is confirmed whether the board retrieval complete information from board retrieving device M9 has been acquired (ST10). If it is confirmed that the board retrieval complete information has not been acquired in (ST10), the process returns to (ST9). If it is confirmed that the board retrieval complete information has been acquired in (ST10), it is determined that the board accommodation state in board retrieving device M9 has returned to the normal state and the process returns to (ST1) with the line being restarted (ST11).

Next, manufacturing process time adjustment process flow (2) will be described with reference to FIG. 5. When manufacturing process time adjustment process flow (2) in FIG. 5 is started and the process is started, line controller 10 determines whether the third warning information from board retrieving device M9 has been acquired or not (ST12). If it is not confirmed that the third warning information has been acquired, the process returns to (ST12) and monitoring is continued. If it is confirmed that the third warning information has been acquired, the operator is notified that board retrieving device M9 has been stopped (ST13). That is, notifier 12 included in comprehensive line control device 4 notifies the operator of the above-described instruction or instruction information is transmitted to portable terminal 40 carried by the operator and is displayed on display 41 so that the operator is notified of the above-described instruction.

Next, it is determined whether the operator is in the vicinity of component mounting line 1*a* based on operator location information output from position information specifier 43 of portable terminal 40 (ST14). In a case where it is determined that the operator is in the vicinity of component mounting line 1*a* in (ST14), it is determined whether a transportation stopping signal indicating "transportation stoppage" which is the fourth warning information from the upstream process has been acquired (ST15). If it is confirmed that the transportation stopping signal has not been acquired in (ST15), it is determined whether recovery information, which indicates that a board accommodating function has been recovered, from board retrieving device M9 has been acquired (ST16). If it is determined that the recovery information has not been acquired in (ST16), the process returns to (ST14) and the operator is located again.

In addition, in a case where the location of the operator has not been found in (ST14), a process of lengthening the time taken for the manufacturing process in the upstream process (board supplying device M1 to reflow device M8) is performed (ST17). That is, in a case where acquirer 13*a* acquires the third warning information from board retrieving device M9, line controller 10 performs control to lengthen the time taken for the manufacturing process in board supplying device M1 to reflow device M8, which are the component mounting devices of the upstream process.

Thereafter, it is determined whether the recovery information from board retrieving device M9 has been acquired (ST18). In a case where it is determined that the recovery information has been acquired in (ST18), it is determined whether the transportation stopping signal from the upstream process has been acquired (ST19). In a case where it is determined that the transportation stopping signal has not been acquired in (ST19), the process returns to (ST18). In a case where it is determined that the transportation stopping signal has been acquired in (ST19), the manufacturing process in the line is stopped (ST20). In a case where it is determined that the transportation stopping signal has been acquired in (ST15), the process proceeds to (ST20) and the manufacturing process in the line is stopped as with (ST19). That is, in a case where acquirer 13*a* acquires the transportation stopping signal (fourth warning information) indicating "transportation stoppage" from the component mounting devices of the upstream process, line controller 10 performs control to causes the component mounting devices of the upstream process to stop the manufacturing process.

Thereafter, it is determined whether the recovery information from board retrieving device M9 has been acquired (ST21). If it is determined that the recovery information has not been acquired in (ST21), the process returns to (ST20). If it is determined that the recovery information has been acquired in (ST21), the process returns to (ST12) with the line being restarted (ST22). In addition, in a case where it is determined that the recovery information from board retrieving device M9 has been acquired in (ST16) or (ST18), the process returns to (ST12) with the line being restarted (ST22) as with (ST21).

As described above, the component mounting line control system according to the embodiment has a function of controlling component mounting line 1*a*. Component mounting line 1*a* includes the plurality of component mounting devices (board supplying device M1 to reflow device M8) and the board retrieving unit (board retrieving device M9). Each component mounting device mounts a component to manufacture a board. The board retrieving unit retrieves the board.

The component mounting line control system includes acquirer 13*a* and a controller (line controller 10). Acquirer 13*a* acquires information from the board retrieving unit that retrieves the board. The controller controls each component mounting device based on the acquired information.

According to the above-described configuration, acquirer 13*a* acquires the first warning information, the second warning information, and the third warning information which are information related to the board accommodation limit from the board retrieving unit (board retrieving device M9). In addition, acquirer 13*a* acquires the fourth warning information which is information related to the board transportation state from the component mounting devices (board supplying device M1 to reflow device M8). In a case where acquirer 13*a* acquires the warning information, line controller 10 controls each device in component mounting line 1*a* that has transmitted the warning information and performs appropriate control processing. The appropriate control processing is processing for suppressing congestion of boards in the board retrieving unit that is at the exit of component mounting line 1*a*. Examples of the appropriate control processing include lengthening the time taken for the manufacturing process and stopping the manufacturing process. As a result, it is possible to prevent a decrease in operating rate of component mounting line 1*a* and to improve the productivity.

According to the present disclosure, it is possible to suppress congestion of boards at the exit of the component mounting line and thus it is possible to prevent a decrease in operating rate of the component mounting line and to improve the productivity.

According to the component mounting line control system in the present disclosure, it is possible to suppress congestion of boards at the exit of the component mounting line and thus it is possible to prevent a decrease in operating rate of the component mounting line and to improve the productivity. Therefore, the component mounting line control system is useful for the field of component mounting technologies for mounting an electronic component on a board.

What is claimed is:

1. A component mounting system comprising:
 a component mounting line for manufacturing a board including:
  a component mounting device that mounts a component on the board; and
  a board retrieving unit that retrieves the board, the board retrieving unit positioned in the component mounting line and downstream from the component mounting device and configured to hold a predetermined number of boards, and
 a component mounting line control system comprising:
  an acquirer that acquires information from the board retrieving unit;
  a controller that controls the component mounting device based on the information acquired by the acquirer; and
  a notifier that performs notification of a state of the board retrieving unit,
 wherein, during the board manufacturing, the controller adjusts an operating state of the component mounting device from a normal state, in which the component mounting device is operated normally, to a first state, in which a manufacturing process time is lengthened without stopping the component mounting device, when the acquirer acquires first warning information, which indicates that a number of boards in the board retrieving unit is equal to or greater than a first percentage and equal to or smaller than a second percentage of an accommodation capacity of the board retrieving unit,
 wherein the operating state of the component mounting device returns to the normal state when a board retrieval process has been completed such that the number of boards in the board retrieving unit is less than the first percentage of the accommodating capacity of the board retrieving unit, and
 wherein a component-mounted board is manufactured in the component mounting system by mounting the component on the board through soldering.

2. The component mounting system of claim 1, wherein the first warning information indicates that the number of boards in the board retrieving unit is equal to or greater than 70% and equal to or smaller than 90% of the accommodation capacity of the board retrieving unit.

3. The component mounting system of claim 1, wherein the controller causes the component mounting device to stop the manufacturing process in a case where the acquirer acquires second warning information, which indicates that the board accommodation limit has been reached, from the board retrieving unit.

4. The component mounting system of claim 3, wherein a state where the board accommodation limit has been reached is a state where the number of accommodated boards is greater than 90% and equal to or smaller than 100% of an accommodation capacity of the board retrieving unit.

5. The component mounting system of claim 1, wherein the controller lengthens the time taken for the manufacturing process in the component mounting device in a case where the acquirer acquires third warning information, which indicates that there is an abnormality, from the board retrieving unit.

6. The component mounting system of claim 1, wherein the controller causes the component mounting device to stop the manufacturing process in a case where the acquirer acquires fourth warning information, which indicates a transportation stoppage, from the component mounting device.

7. The component mounting system of claim 5, further comprising:
 a position information specifier;
 wherein the controller determines whether the operator is in the vicinity of component mounting line based on an operator location information output from the position information specifier, and in a case where the location of the operator has not been found, the controller lengthens the time taken for the manufacturing process in the component mounting device.

8. The component mounting system of claim 1, wherein the manufacturing process time of the component mounting device in the first state is lengthened by decreasing a transportation speed of the component mounting device without stopping the component mounting device.

9. The component mounting system of claim 1, wherein the manufacturing process time of the component mounting device in the first state is lengthened by increasing a time interval of a supplying operation.

10. A component mounting line control system which controls a component mounting line including a component mounting device that mounts a component on a board and a board retrieving unit that retrieves the board, the system comprising:
 an acquirer that acquires information from the board retrieving unit;
 a controller that controls the component mounting device based on the information acquired by the acquirer; and
 a position information specifier;
 wherein the controller determines whether an operator is in a vicinity of the component mounting line based on an operator location information output from the position information specifier, and in a case where the location of the operator has not been found, the controller adjusts an operating state of the component mounting device from a normal state to a first state in which the manufacturing process time of the component mounting device is lengthened without stopping the component mounting device,
 wherein the time taken for the manufacturing process in the component mounting device returns to the normal state when the operator is determined to be in the vicinity of the component mounting line, and
 wherein a component-mounted board is manufactured in the component mounting line by mounting the component on the board through soldering.

11. The component mounting line control system of claim 10, wherein the manufacturing process time of the component mounting device in the first state is lengthened by at least one of decreasing a transportation speed of the component mounting device without stopping the component mounting device and increasing a time interval of a supplying operation.

* * * * *